United States Patent
Parkinson et al.

(10) Patent No.: US 7,471,552 B2
(45) Date of Patent: Dec. 30, 2008

(54) ANALOG PHASE CHANGE MEMORY

(75) Inventors: Ward D. Parkinson, Boise, ID (US); Allen Benn, Alexandria, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 972 days.

(21) Appl. No.: 10/634,153

(22) Filed: Aug. 4, 2003

(65) Prior Publication Data
US 2005/0030788 A1    Feb. 10, 2005

(51) Int. Cl.
*G11C 11/00* (2006.01)
(52) U.S. Cl. .................. 365/163; 365/45; 365/151; 365/113; 365/176
(58) Field of Classification Search ............... 365/163, 365/151, 113, 176
See application file for complete search history.

(56) References Cited

U.S. PATENT DOCUMENTS

| | | | | |
|---|---|---|---|---|
| 4,782,340 | A * | 11/1988 | Czubatyj | 340/825.83 |
| 5,414,271 | A * | 5/1995 | Ovshinsky et al. | 257/3 |
| 5,745,409 | A | 4/1998 | Wong et al. | 365/185.03 |
| 5,778,134 | A * | 7/1998 | Sakai et al. | 386/46 |
| 5,789,277 | A * | 8/1998 | Zahorik et al. | 438/95 |
| 5,815,425 | A | 9/1998 | Wong et al. | |
| 5,825,046 | A * | 10/1998 | Czubatyj et al. | 257/2 |
| 5,933,365 | A * | 8/1999 | Klersy et al. | 365/148 |
| 6,031,287 | A * | 2/2000 | Harshfield | 257/734 |
| 6,044,004 | A | 3/2000 | Kramer | |
| 6,189,582 | B1 * | 2/2001 | Reinberg et al. | 438/239 |
| RE37,259 | E * | 7/2001 | Ovshinsky | 365/163 |
| 6,454,915 | B1 * | 9/2002 | Shiratori et al. | 204/192.2 |
| 6,646,902 | B2 * | 11/2003 | Gilton et al. | 365/100 |
| 6,750,101 | B2 * | 6/2004 | Lung | 438/257 |
| 6,777,705 | B2 * | 8/2004 | Reinberg et al. | 257/2 |
| 6,797,612 | B2 * | 9/2004 | Zahorik | 438/639 |
| 6,797,978 | B2 * | 9/2004 | Gonzalez et al. | 257/3 |
| 6,809,362 | B2 * | 10/2004 | Gilton | 257/296 |
| 6,879,525 | B2 * | 4/2005 | Van Brocklin et al. | 365/189.09 |
| 6,888,155 | B2 * | 5/2005 | Campbell et al. | 257/2 |

FOREIGN PATENT DOCUMENTS

EP    0 788 257    8/1997

(Continued)

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 20-26, 2003.

(Continued)

*Primary Examiner*—Viet Q Nguyen
(74) *Attorney, Agent, or Firm*—Trop, Pruner & Hu, P.C.

(57) ABSTRACT

An analog memory may be formed using a phase change material. The phase change material may assume one of a number of resistance states which defines a specific analog characteristic to be stored.

22 Claims, 3 Drawing Sheets

FOREIGN PATENT DOCUMENTS

| WO | WO 93/04506 | 3/1993 |
| WO | WO 95/20224 | 7/1995 |
| WO | WO 03/058632 | 7/2003 |
| WO | WO2004/036554 A2 * | 4/2004 |

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

A.F. Murray et al., *A User's Guide to Non-Volatile On-Chip Analogue Memory*, Electronics and Communication Engineering Journal, Institute of Electrical Engineers, London, GB, vol. 10, No. 2, Apr. 1, 1998, pp. 53-63.

T.F. Blake, *Investigation of Ge2Te2Sb5 Chalcogenide Films For Use As An Analog Memory*, Thesis, USA, Mar. 2000, pp. 1-107.

* cited by examiner

ANALOG PHASE CHANGE MEMORY

BACKGROUND

This invention relates generally to analog memories.

Usually, semiconductor non-volatile memories store digital data in the form of either a 1 or a 0, or as 00, 01, 10, 11. Thus, each memory cell may store one to four digital states or 2 bits of information.

However, information to be stored may be in the form of smoothly varying analog information. Analog information may include the characteristics of a non-periodic wave such as a sound wave. In order to digitize this information, a large number of samples are taken at various slices of time. Information corresponding to each sample may be taken as time slices along the time domain of the signal. For each slice the amplitude or average amplitude during that slice of time may be digitized into n bits (usually 8 or more bits). As a result, a number of digital bits may be needed to record the information for each time slice.

As an alternative, analog information may be stored in an analog memory capable of storing the magnitude as an analog value instead of as a digitized value. In one case, a range of levels for the memory cells corresponds to a range of analog values. Storing the analog value for each time slice in each memory locations instead of the digitized value as a number of bits stored in several bit locations can reduce the cost of storage.

In view of the large amount of analog information that may need to be stored, it would be desirable to have an analog memory that is able to efficiently store this information. Examples of storable analog information include audio and video information, radio signals, and other wireless signals.

Thus, there is a need for better ways to provide analog memories.

DETAILED DESCRIPTION

Figure 1:
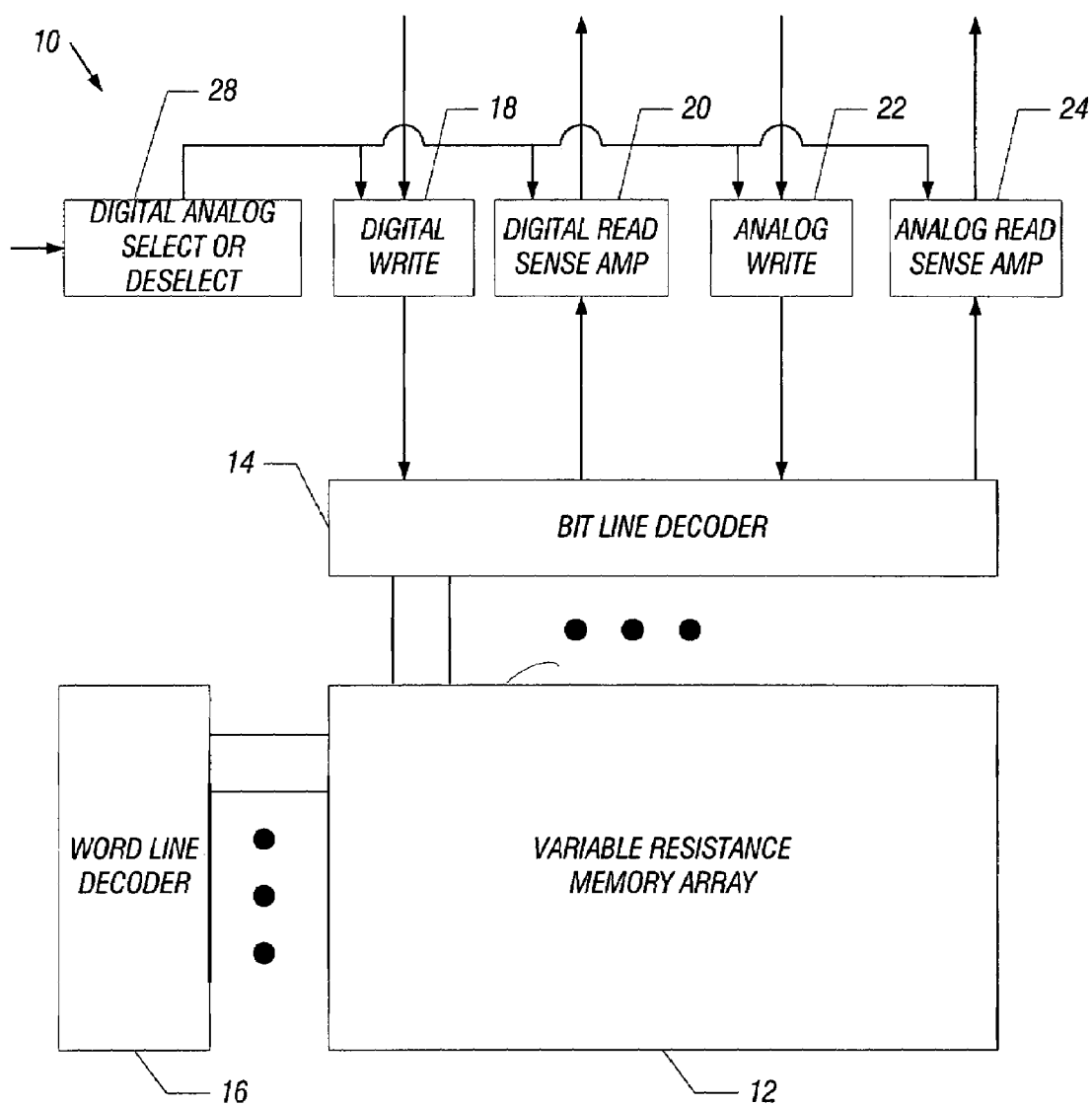
FIG. 1 is a schematic depiction of one embodiment of the present invention.

Referring to FIG. 1, a memory 10 may include a variable resistance memory array 12. The variable resistance memory array 12, in one embodiment, may be a phase change memory. The variable resistance memory array 12 may include a plurality of cells arranged in rows and columns. The cells may include a phase change memory material. A cell may be associated with a word line, addressable by a word line decoder 16, and a bit line or column line, addressable by a bit line decoder 14.

An analog digital select or deselect interface 28 allows the user to provide an input (indicated by an arrow) to select the storing or reading out of data in either an analog form or a digital form. The interface 28 is coupled to a digital write interface 18, a digital read sense amplifier 20, an analog write interface 22, and an analog read sense amplifier 24. The write interfaces 18 and 22 provide signals to the bit line decoder 14 that may be utilized to program selected cells within the array 12. In the case of the digital write interface 18, the information may be one of two or more selectable digital states.

However, in the case of the analog write interface 22, one of a large number of write states may be written into one cell. A cell may be selectively set to a desired resistance value to thereby determine a very specific piece of information. In some embodiments one of at least three different resistance levels may be stored in a cell.

Figure 2:
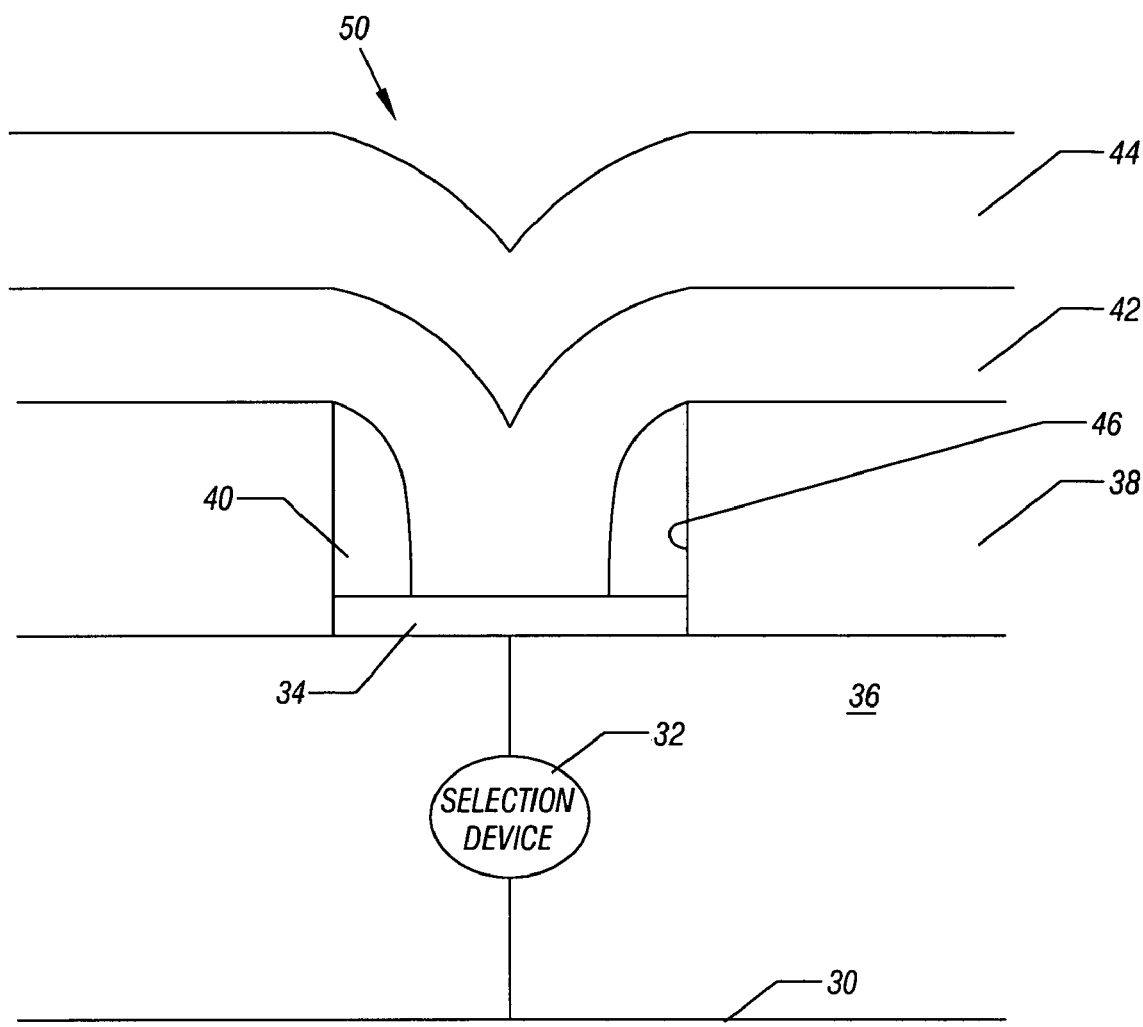
FIG. 2 is a partial schematic and partial cross-sectional view of a cell in accordance with one embodiment of the present invention.

Referring to FIG. 2, a cell 50 in the array 12 may be formed over a substrate 36. The substrate 36, in one embodiment, may include a conductive line 30 coupled to a selection device 32. The selection device 32, in one embodiment, may be formed in the substrate 36 and may, for example, be a diode, transistor, or a device using a phase change material.

The selection device 32 may be electrically coupled to a lower electrode 34 formed in a pore 46. The pore 46 may be defined as an aperture in an insulating layer 38. Sidewall spacers 40 may be formed in the pore 46 in one embodiment.

A phase change material 42 may be formed into the pore and over the insulator 38. An upper conductive line 44 may then be formed over the phase change material 42 in one embodiment.

In one embodiment, a cell 50 may include a phase change material 42 that may be set to a desired resistance over a range from a lower resistance of about 5000 ohms or less and up to a higher resistance of 200,000 ohms or more. This variable resistance may be set by varying the magnitude of the reset current to the cell in one embodiment. After forcing the programming current, the resistance may be read and readjusted by reforcing a slightly different program current if needed to achieve better precision. By making the resistance proportional to voltage or current that is intended to be stored, an analog memory results.

For example, in one embodiment, a waveform may be sampled periodically and the voltage or current of the waveform may be measured at periodic intervals along the waveform. The measured current or voltage may be stored proportionately as a resistance in the variable resistance memory array 12. Then upon reading, the resistance can be converted back to a voltage in proportion to the amount of resistance stored in the memory array 12.

As a merely illustrative example, the voltage waveform of an audio recording signal may be sampled every 0.0005 seconds and the voltage may be measured for conversion into a resistance. If, for example, the allowed resistance range were 5K to 100K ohms and the measured voltage range was −1 volt to +1 volt, the voltages are proportionately converted into resistances and written into cells as a resistance with a feedback. The feedback may involve writing with an appropriate current pulse and then repeating such writing as needed with a larger or smaller pulse to program the desired resistance. Alternately, the slope of the current pulse may be varied to achieve the resistance. The bit may be rewritten at varying pulse heights and trailing edge slopes until the bit is adequately close to the desired resistance value. Then, the next voltage at the next sampling time is written.

Larger resistances may drift more, so the resistance range may be limited to the lower values (such as between 5 and 10K ohms) where the bit is nearly crystalline. If all the bits in a block are written at one time, for example to record an audio song or a video frame, a larger range of resistance may be written in known pre-selected locations in the array 12. In some embodiments the resistance value may be written outside of the actual memory array 12. Then, when reading out the array 12 or outside the array 12, resistances can be prorated to lower or higher resistance values by reading the lower or higher first and then prorating the resistances in the rest of the array 12 accordingly.

In another embodiment, a range of resistances may be used linearly proportionate to the input voltage between 5 and 10K for −1V to 0V. From 0V to 1V, the resistance stored may be linearly proportionate to 10K to 100K. With such a method, or one like it apparent to one skilled in the art, additional compensation for the temperature variation in higher resistance values may be accommodated.

In one embodiment, the phase change material 18 may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material may be chalcogenide element composition from the class of tellurium-germanium-antimony ($Te_xGe_ySb_z$) material or a GeSbTe alloy, although the scope of the present invention is not limited to just these materials.

In one embodiment, if the memory material 42 is a non-volatile, phase change material, the memory material 42 may be programmed into one of at least two memory states by applying an electrical signal to the memory material 42. An electrical signal may alter the phase of the memory material 42 between a substantially crystalline state and a substantially amorphous state, wherein the electrical resistance of the memory material 42 in the substantially amorphous state is greater than the resistance of the memory material in the substantially crystalline state. Accordingly, in this embodiment, the memory material 42 may be adapted to be altered to a particular one of a number of resistance values within a range of resistance values to provide digital or analog storage of information.

Programming of the memory material to alter the state or phase of the material may be accomplished by applying voltage potentials to the lines 30 and 42, thereby generating a voltage potential across the memory material 42. An electrical current may flow through a portion of the memory material 42 in response to the applied voltage potentials, and may result in heating of the memory material 42.

This heating and subsequent cooling may alter the memory state or phase of the memory material 42. Altering the phase or state of the memory material 42 may alter an electrical characteristic of the memory material 42. For example, resistance of the material 42 may be altered by altering the phase of the memory material 42. The memory material 42 may also be referred to as a programmable resistive material or simply a programmable resistance material.

In one embodiment, a voltage potential difference of about 3 volts may be applied across a portion of the memory material by applying about 3 volts to a line 44 and about zero volts to an upper line 30. A current flowing through the memory material 42 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 42 may be heated to a relatively higher temperature to amorphisize memory material and "reset" memory material. Heating the volume or memory material to a relatively lower crystallization temperature may crystallize memory material and "set" memory material. Various resistances of memory material may be achieved to store information by varying the amount of current flow and duration through the volume of memory material.

The information stored in memory material 42 may be read by measuring the resistance of the memory material. As an example, a read current may be provided to the memory material using opposed lines 30, 44 and a resulting read voltage across the memory material may be compared against a reference voltage using, for example, a sense amplifier (not shown). The read voltage may be proportional to the resistance exhibited by the memory storage element.

Figure 3:
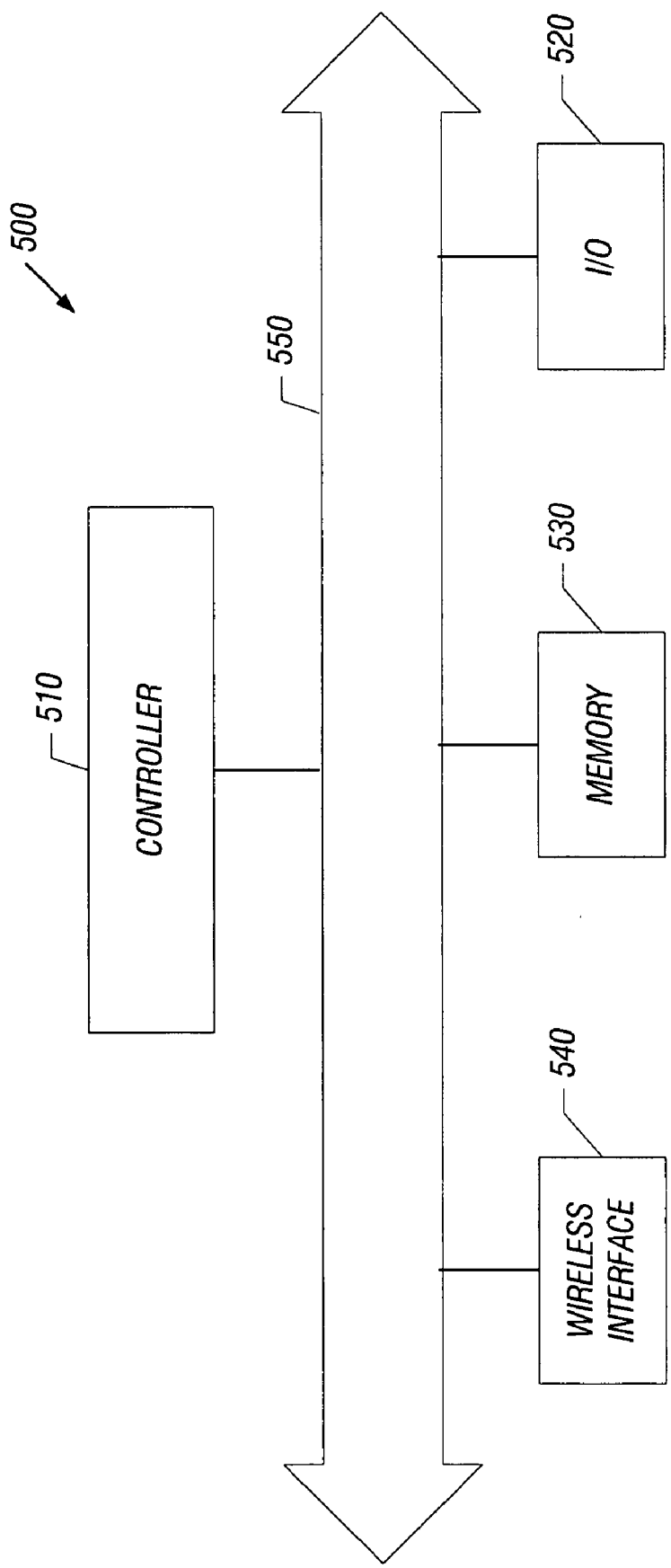
FIG. 3 is a system depiction of one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory that includes a memory element such as, for example, memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an analog memory using a phase change material; and
   selectively enabling either digital or analog data to be stored in said memory.

2. The method of claim 1 including forming a phase change material having a programmably variable resistance for a plurality of cells.

3. The method of claim 2 including enabling said cells to be addressably located along rows and columns.

4. The method of claim 1 including forming a phase change material in a pore.

5. The method of claim 4 including forming a selection device to enable the control of current through said phase change material.

6. The method of claim 1 including enabling said memory to store in a single cell one of at least three different resistance values.

7. The method of claim 6 including enabling the resistance of the cell to be set by varying the magnitude of a programming current to the cell.

8. The method of claim 7 including enabling the resistance of the cell to read and readjust using a different programming current.

9. The method of claim 8 including enabling a resistance to be set in said cell proportional to a voltage or current characteristic to be stored.

10. A memory comprising:
    a phase change material;
    a circuit to write analog data using said phase change material; and
    a circuit to selectively enable either digital or analog data to be stored in said memory.

11. The memory of claim 10 wherein said phase change material has a programmably variable resistance.

12. The memory of claim 11, said memory to store digital and analog data.

13. The memory of claim 12 wherein said memory to selectively store digital or analog data.

14. The memory of claim 13 including a circuit to enable a user to select analog or digital data storage.

15. The memory of claim 14 including an analog read sense amplifier, a digital read sense amplifier, an analog write circuit, and a digital write circuit.

16. The memory of claim 10 including a substrate, an insulator formed over said substrate, a pore defined in said insulator, and a phase change material in said pore.

17. The memory of claim 10 including a plurality of cells including a phase change material, said memory including a plurality of conductive lines to selectively enable access to said cells.

18. The memory of claim 17 wherein said phase change material includes a chalcogenide.

19. A system comprising:
    a processor;
    a wireless interface coupled to said processor;
    a semiconductor memory coupled to said processor, said memory including a phase change material, a circuit to write analog data for storage using said phase change material, and a circuit to selectively enable either digital or analog data to be stored in said memory.

20. The system of claim 19, said memory to store digital and analog data.

21. The system of claim 20 wherein said memory to selectively store digital or analog data.

22. The system of claim 21 including a circuit to enable a user to select analog or digital data storage.

* * * * *